United States Patent [19]

Cobaugh et al.

[11] 3,881,795

[45] May 6, 1975

[54] MOUNTING MEANS FOR DIODE MATRIX

[75] Inventors: Robert Franklin Cobaugh, Elizabethtown; James Ray Coller, Mechanicsburg, both of Pa.

[73] Assignee: AMP Incorporated, Harrisburg, Pa.

[22] Filed: May 2, 1974

[21] Appl. No.: 466,101

[52] U.S. Cl. ........... 339/17 C; 339/17 D; 339/17 L; 339/147 P

[51] Int. Cl. ........................................ H05k 1/12

[58] Field of Search ........... 339/17 C, 17 L, 17 LM, 339/17 D, 18 P, 93 R, 93 LC, 147 R, 147 C, 147 P

[56] References Cited

UNITED STATES PATENTS 3,488,628 1/1970 Lundergan et al. ............... 339/17 L

FOREIGN PATENTS OR APPLICATIONS 1,123,304 8/1968 United Kingdom............... 339/17 D

*Primary Examiner*—Roy Lake
*Assistant Examiner*—E. F. Desmond
*Attorney, Agent, or Firm*—William J. Keating, Esq., Donald W. Phillion, Esq.

[57] ABSTRACT

An inexpensive means for mounting large numbers of diodes on a circuit board to form a matrix comprising a series of inverted, U-shaped channels which are positioned side-by-side, in parallel arrangement, with each channel having a plurality of first holes therein. Each of these first holes are positioned over a smaller second hole in the board, with a small female receptacle either formed or inserted in each of said second holes. The U-shaped channels bridge over the small female receptacles without touching them. A diode having a first wire-like terminal is inserted down through each pair of concentric first and second holes so that its wire-like terminal fits into the small female receptacle. The conductive casing of the diode, which is connected to its second terminal, fits snugly within said first hole in said U-shaped channel and makes electrical contact with said channel.

20 Claims, 11 Drawing Figures

SECTION A-A OF FIG. 6

MOUNTING MEANS FOR DIODE MATRIX

BRIEF STATEMENT OF BACKGROUND OF THE INVENTION

This invention relates generally to means for mounting diodes on a printed circuit board and more particularly for mounting diodes in a matrix arrangement on a printed circuit board.

Diode matrixes mounted on printed circuit boards are well known in the art. In general it is desirable to have one terminal of the diode attached to a first, i.e., top side, of the board and the other terminal to extend through the board and connect electrically to the other or bottom side of the board. Printed circuits and other necessary elements are then added to the board to complete a diode matrix arrangement. For some time problems have existed in economically mounting the diodes on the board. More specifically, in the prior art it has been necessary to provide means for individually mounting each diode on the printed circuit board so that each diode is securely mounted on the board and is able to withstand required shock and vibration environment without breaking loose from its mounting and without making undesirable connections.

One successful means of mounting the diodes on the printed circuit board is disclosed in U.S. Pat. No. 3,760,329, issued Sept. 18, 1973, to William E. Stephan, entitled "Mated Connector Apparatus For Printed Wiring Boards" and assigned to GTE Automatic Electric Laboratories, Inc., Northlake, Ill.

In this mounting technique a cylindrical cup with a hole in the bottom is placed over a plated-through hole on the printed circuit board. A miniature socket is then slipped through a rubber or other insulating washer and then inserted down into the cylindrical cup and into the hole in the printed circuit board. The rubber washer functions both to secure the cylindrical cup to the surface of the printed circuit board and also to insulate the miniature socket from the cylindrical cup.

The diode is then inserted into the cylindrical cup with a first of its two terminals extending into the miniature socket and the other terminal, which is usually the outer casing of the diode, making electrical contact with the cylindrical cup, fitting snugly inside said cylindrical cup. The bottom of the cylindrical cup makes contact with the top side of the printed circuit board, and the miniature socket connects the first diode terminal to the bottom side of the printed circuit board. The foregoing technique, while very effective from a functional point of view, is expensive to manufacture.

BRIEF STATEMENT OF THE INVENTION

It is a primary object of the present invention to provide a more inexpensive means of mounting diodes in a row on a printed circuit board than heretofor known.

It is a second purpose of the invention to provide a common, conductive, channel-shaped member having holes therein, each of which holds a diode and performs the function of the single cylindrical cup of the prior art in both mechanically holding the diodes in place on the board and in making the electrical connection between the diodes and the board.

A third primary aim of the invention is to provide a diode holding member which can be inexpensively stamped from a flat piece of metal and is capable of holding a large number of diodes on a printed circuit board and also to make electrical connection between each of said diodes and a circuit path on the printed circuit board.

A fourth aim of the invention is the improvement generally of means for mounting diodes upon printed circuit boards, and particularly in diode matrix type arrangements.

In accordance with a preferred form of the invention there is provided, in combination with a printed circuit board having a row of holes formed therein and with small tube-like receptacles inserted through each of said holes, a diode holder comprising a generally elongated, channel-like element with a generally U-shaped, cross-sectional configuration, mounted upside down over said row of holes in the printed circuit board. A second row of holes is formed in the top surface of the inverted U-shaped channel with one of said second holes being located over, and substantially concentric with, the hole in the printed circuit board over which it is mounted. Appendages are provided along the bottom edges of the inverted U-shaped channel which engage apertures provided therefore in the printed circuit board to secure said inverted channel firmly upon said printed circuit board.

The dimensions of the inverted U-shaped channel and the miniature socket covered thereby and inserted in apertures in the circuit board are such that no physical contact is made between the miniature sockets and the inverted U-shaped channel.

Cylindrically shaped diodes having one terminal therein connected to the conductive cylindrical casing are inserted in the holes in the inverted channel whose diameters are substantially the same as that of the diode casing, thereby making electrical contact therebetween. The other contact of each diode is in the form of a wire which enters the miniature socket as the diode is inserted through the hole in the inverted channel. Thus, the inverted channel makes contact between first terminals of the diode and the top surface of the printed circuit board, and the miniature sockets connect the other diode terminal to the bottom surface of the printed circuit board.

In accordance with one specific form of the invention the sides of the U-shaped channel have finger-like sections stamped therein, but with one end of said fingers remaining secured to the channel, and with the free ends of said finger-like sections bent inwardly in a curved manner to form a support for the side of the inserted diode. Such finger-like elements are formed along both sides of said inverted channel so that one of such finger-like elements is positioned on each side of each of said diodes in approximately 180° relationship with each other with respect to the diode circumference.

In accordance with another specific form of the invention the sides of the U-shaped channel are bent inwardly between the holes in the channel to form partial cylindrically-shaped sections. Each of these partial cylinders in each wall of the channel is positioned oppositely a similar partial cylinder on the other wall of the channel, with the axes of each pair of oppositely positioned partial cylinders being substantially coincident with the axis of the cylindrical diode inserted therebetween. The partial cylindrical sections of the channel walls fit snugly against the cylindrically-shaped diode casing and function to hold it in place on the printed circuit board, as well as to make good electrical contact with one terminal thereof.

It is to be understood that there is an aperture in the inverted U-shaped channel between the oppositely positioned partial cylinders of the side walls into which the diode is inserted, and also that there is a miniature socket located directly below the aperture in the channel which functions to receive the other terminal of the diode.

BRIEF STATEMENT OF THE DRAWINGS

The above-mentioned and other objects and features of the invention will be more fully understood from the following detailed description thereof when read in conjunction with the drawings in which.

DETAILED DESCRIPTION OF THE INVENTION

Figure 1:
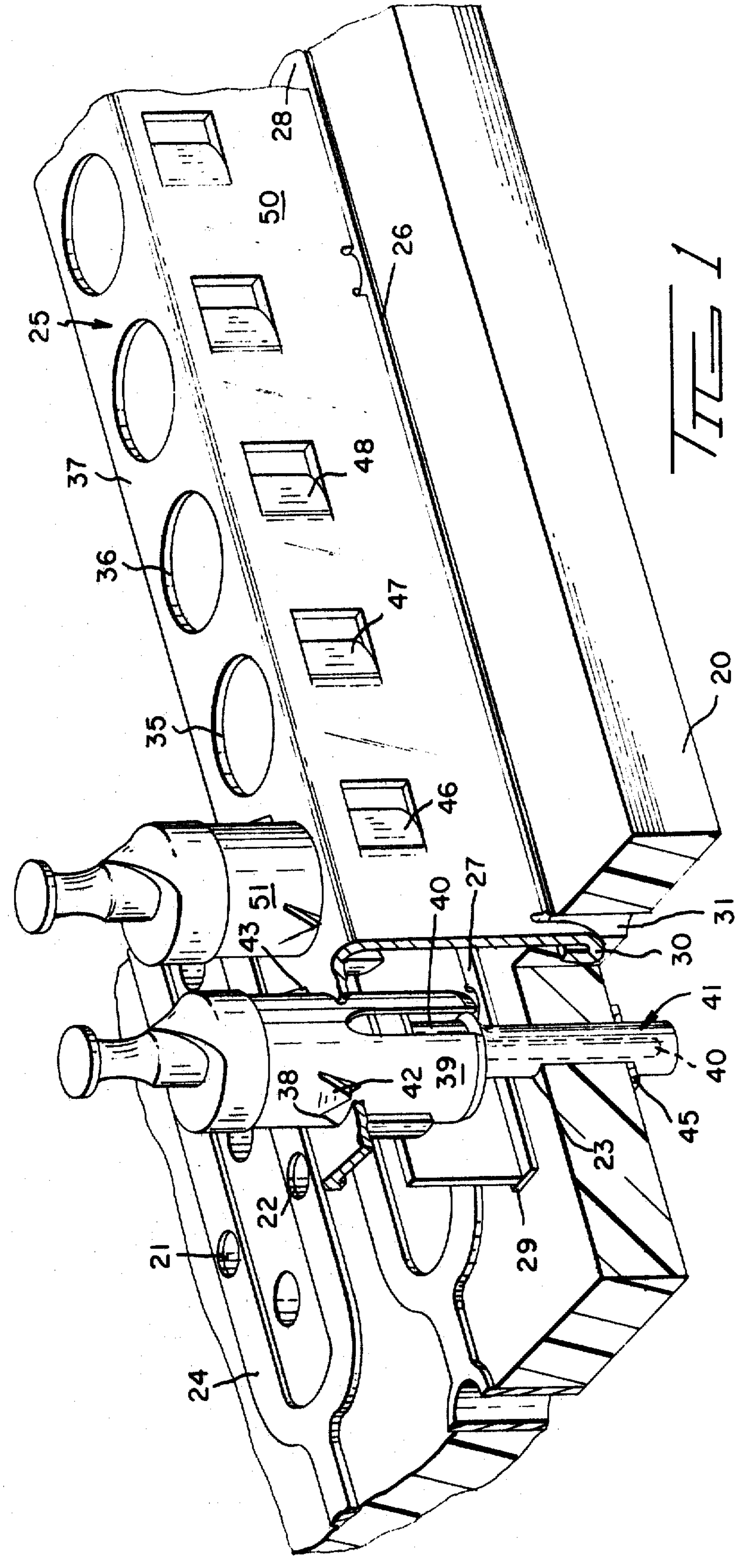
FIG. 1 is a perspective view of the entire assembly of the invention including the printed circuit board, the miniature socket, and the inverted U-shaped channel mounted thereon, with two diodes installed and with a portion of the structure broken away to more clearly show the relation of the various elements.

Refering now to FIG. 1 there is shown a printed circuit board 20 having a series of apertures therein, such as apertures 21 and 22 and 23. Each of these apertures 21 – 23 ordinarily lies in the center of a conductive circuit path such as circuit path 24. The inverted U-shaped channel 25 is mounted in its inverted position so that its two open edges 26 and 27 rest upon conductive paths 28 and 29 on the printed circuit board 20. Appendages, such as appendage 30, enter into apertures, such as aperture 31, in the printed circuit board 20 to secure the inverted channel 25 securely upon the surface of the board 20. A series of holes, such as holes 38, 35 and 36 are centered concentrically over one of the holes in the printed circuit board. Thus, for example, hole 38 which holds the diode 39, is centered over the hole 23 in the circuit board 20.

The diode 39 is then inserted through the hole 38 so that its lower terminal 40, which can be a wire shaped terminal, fits into the miniature socket 41, which in turn is inserted in hole 23 of circuit board 20. The conductive outer casing of the diode 39 has tangs 42 and 43 formed thereon which function to limit the depth that the diode 39 can be inserted into the hole 38. This depth is designed to prevent electrical contact between the metallic casing of the diode 38 and any part of the miniature socket 41.

Figures 3, 4, 5, 9:
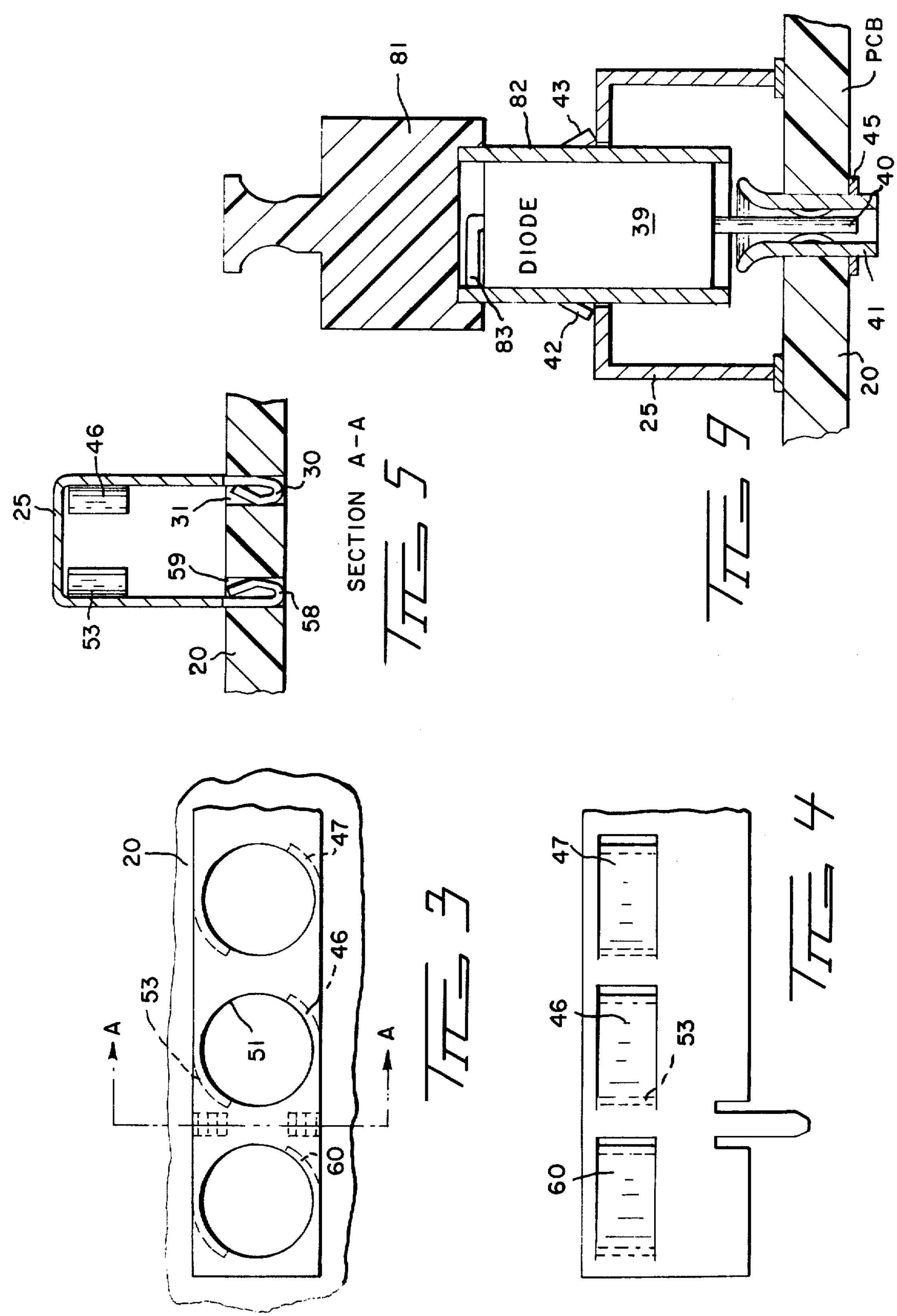
FIG. 3 is a top view of the inverted U-shaped channel.
FIG. 4 is a side view of the inverted U-shaped channel of FIG. 3.
FIG. 5 is an end view of the inverted U-shaped channel of FIG. 3 and also includes a showing of how the appendages on the U-shaped channel secure the channel to a printed circuit board.
FIG. 9 is a sectional view of the entire assembly of a single U-shaped channel, the miniature spring socket, the printed circuit board, and the diode inserted therein.

The foregoing clearances can be more clearly seen from FIG. 9, wherein reference character 82 identifies the outer metallic casing of the diode 39 contained therein. It can be seen that tangs 42 and 43 rest upon the top of the U-shaped channel 25 and prevent the diode casing 82 from coming into contact with the miniature socket 41 and therefore with the bottom surface of printed circuit board 20. The top terminal 83 of diode 39 is connected to its conductive outer casing 82, which in turn is electrically connected to the U-shaped channel through tangs 42 and 43. The plastic cap 81 is provided to cover lead 83 and to facilitate handling of the diode 39.

It is also to be noted in FIG. 9 that wire-like terminal 40 of diode 39 enters into cup-like miniature socket 41 and makes electrical contact therewith. The socket 41 in turn makes contact with a suitable conductive path 45 on the bottom surface of the printed circuit board 20.

Returning again to FIG. 1, there is shown a series of finger-like elements, such as elements 46, 47 and 48, formed in the side wall 50 of the U-shaped channel 25. Each of these finger-like elements curve inwardly and wrap around a portion of the side of a diode. For example, the curved finger-like portion 46 wraps around the side of the diode 51 in a counterclockwise direction, when viewing the diode 51 from the top. A similar finger-like element 53 (shown in FIG. 3) is formed in the other side wall of channel 25 and wraps around a portion of the other side of diode 51.

Reference is now made to FIG. 3 which shows the two finger-like elements 46 and 43 bent inwardly and configured to become wrapped around diode 51 when diode 51 is inserted therebetween.

Figure 2:
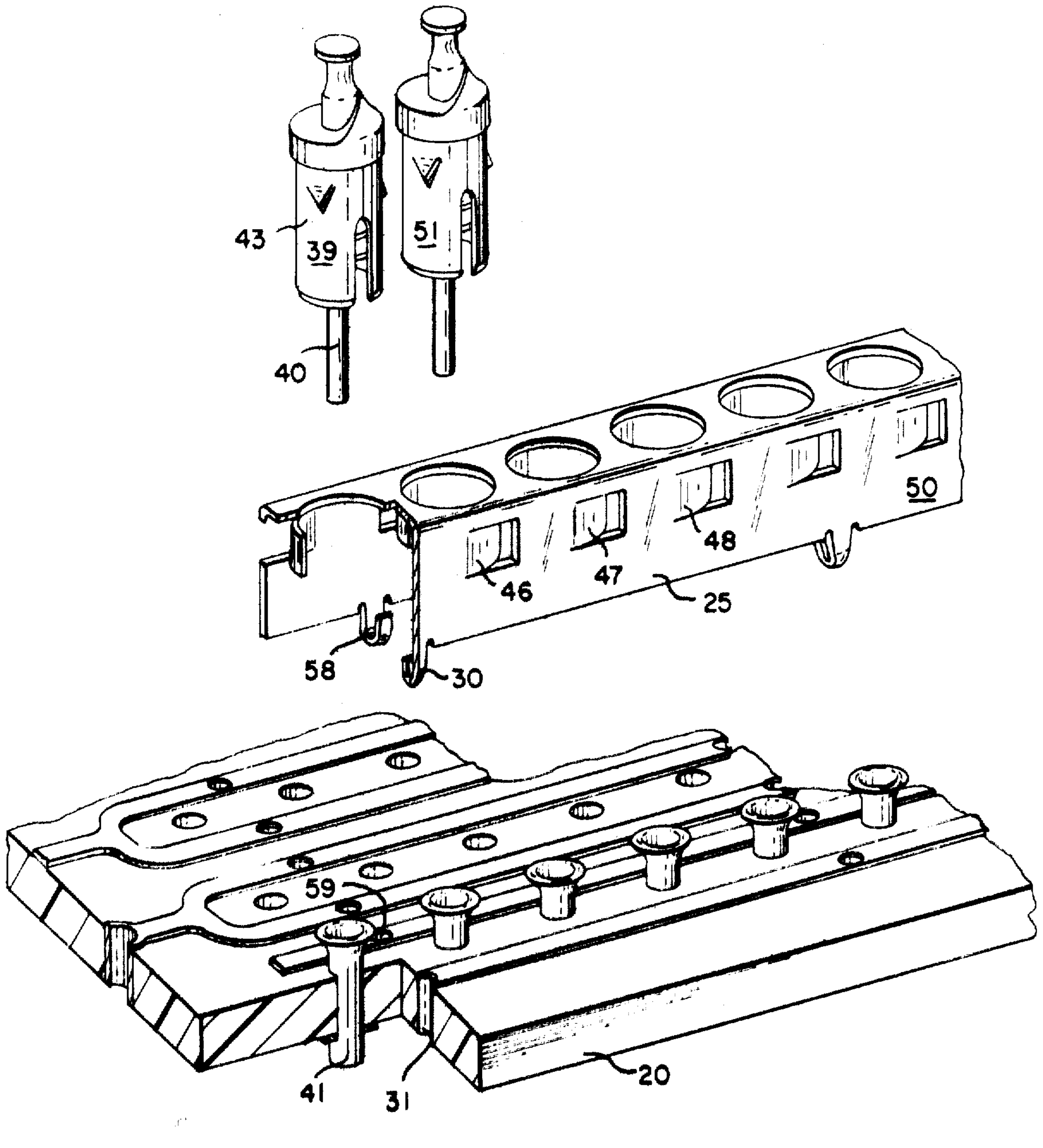
FIG. 2 is an exploded view of FIG. 1.

Referring now to FIG. 2 there is shown an exploded view of FIG. 1. Identical parts of FIG. 2 are identified by the same reference characters as corresponding parts of FIG. 1. It is believed that FIG. 2 is self-explanatory in view of the previous discussion in connection with FIG. 1.

To obtain a better understanding of how the appendages, such as appendages 30 and 58 of FIG. 2, secure the U-shaped channel 25 upon the circuit board 20, reference is made to FIG. 5. In FIG. 5 it can be seen that the appendages 30 and 58 fit into apertures 31 and 59, respectively, in printed circuit board 20. Because of the folded-back configuration of the appendages 30 and 58 they exhibit a spring-like pressure action against the side walls of apertures 31 and 59 to retain the inverted channel 25 securely mounted on board 20.

Reference is now made to FIG. 4 which shows the bent-in fingers, such as fingers 60, 46, 53 and 47, also identified in FIG. 3.

Figure 8:
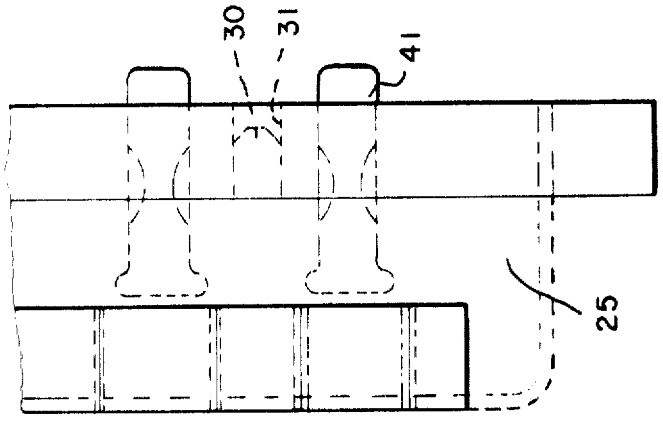
FIG. 8 is a side view of FIG. 7.
Figure 6:
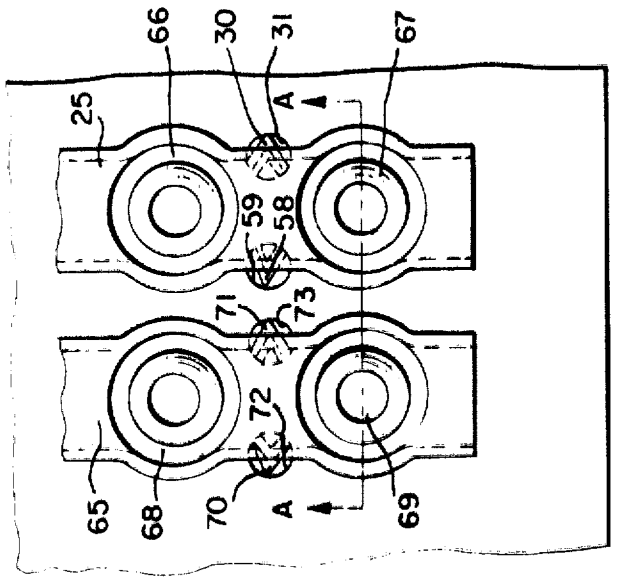
FIG. 6 is a top view of a portion of the assembly similar to that of FIG. 1 and including portions of two U-shaped channels and four diodes installed therein.
Figure 7:
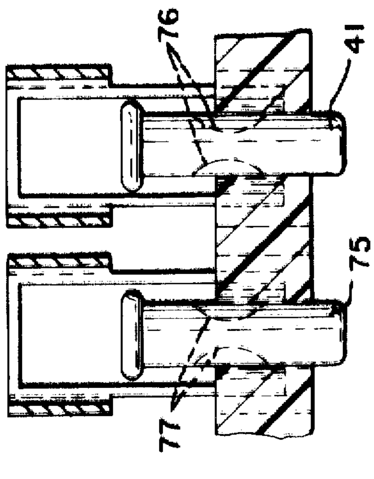
FIG. 7 is a view of FIG. 6 taken along the planar section A—A of FIG. 6.

Consider now the structure of FIGS. 6, 7 and 8. FIG. 6 is a top plan view of a pair of U-shaped channels 25 and 65, each having a pair of diodes shown inserted therein. Channel 25 contains diodes 66 and 67, and channel 65 contains diodes 68 and 69. The appendages 30 and 58 on channel 25 fit into apertures 31 and 59. Channel 65 has similar appendages 70 and 71, which fit into apertures 72 and 73, respectively.

In FIG. 7, which is a sectional view of FIG. 6 along the plane A—A, details of the two miniature sockets 41 and 75 are shown. The pairs of dotted lines 76 and 77 in the two miniature sockets 41 and 75 represent internal, spring-like members which aid in retaining a diode terminal inserted therein, but do not form a part of the present invention. Accordingly no further description of these spring-like members will be made herein.

FIG. 8 shows a side view of FIG. 6 with corresponding parts having similar reference characters.

Figures 10, 11:
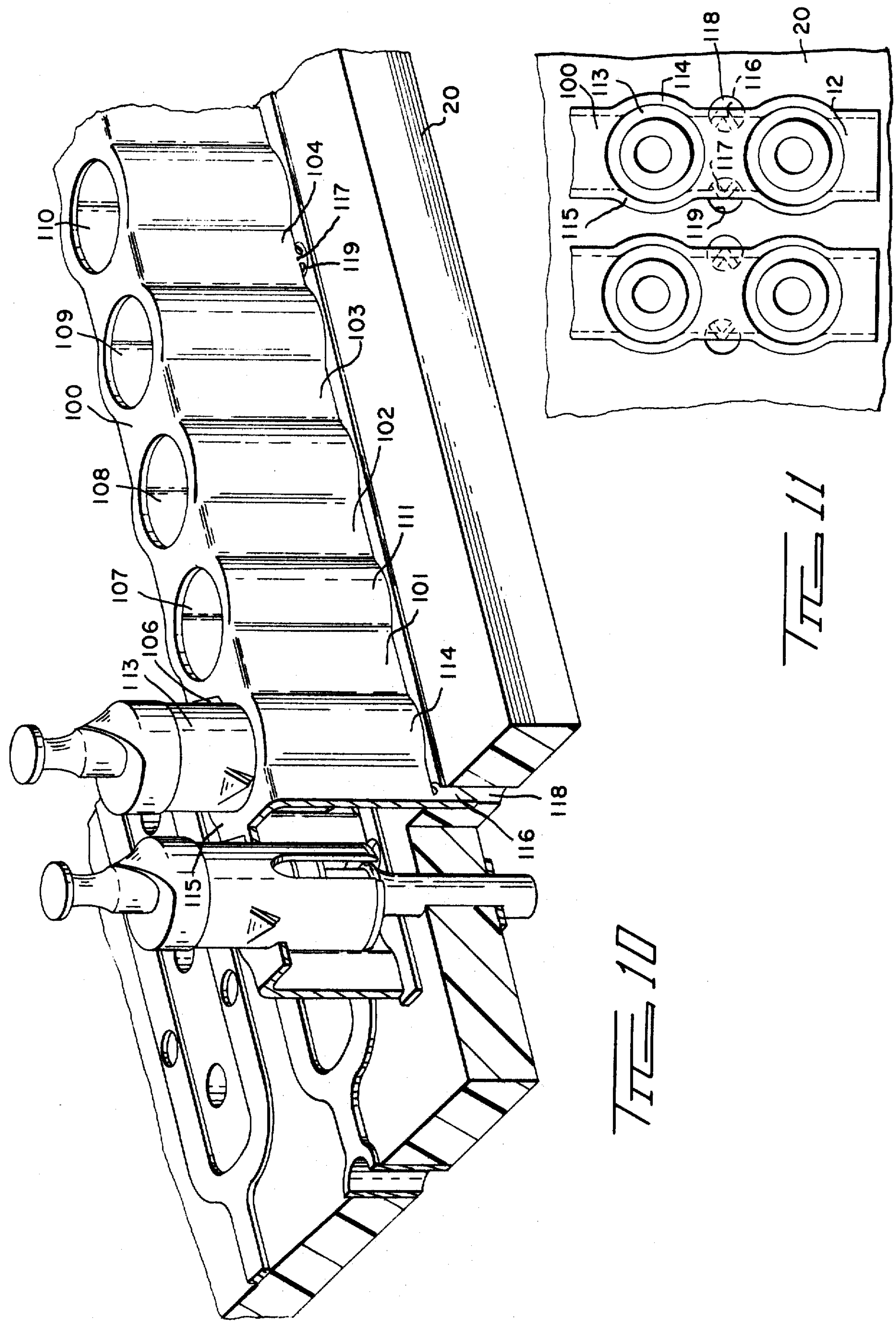
FIG. 10 is a perspective view of another form of the invention shown in a manner similar to that shown in FIG. 1.
FIG. 11 is a top view of a portion of two U-shaped channels of the form of the invention shown in FIG. 10, with each of the two U-shaped channels having a pair of diodes shown therein.

Referring now to FIG. 10 there is shown another form of the invention with a view thereof quite similar to that of FIG. 1. The principal difference between FIG. 1 and FIG. 10 is that the inverted U-shaped channel 100 of FIG. 10 has no finger-like elements formed in the side thereof to wrap around and grip the diodes inserted therebetween. In FIG. 10 the sides of the inverted U-shaped channel 100 are bent inwardly to form vertical channels, such as channels 101, 102, 103 and 104. These channels exist between the apertures 106, 107, 108, 109 and 110 and, in effect, create partial cylinders formed in the side wall of the channel 100 and wrap partially around the apertures 106 through 110. More specifically, the two channels 101 and 102 form a partial cylindrical section 111 therebetween on one side of aperture 107. A similar cylindrical section 112 is formed on the other side of aperture 107. These two vertical cylindrical sections 111 and 112 function to wrap around a portion of the side of a cylindrical diode such as the adjacent diode 113. A top view of the diode 113 is shown in FIG. 11 with two cylindrical portions 114 and 115 formed in the side wall of the inverted channel 100. In FIG. 11 it can be seen how these two vertical cylindrical sections 113 and 114 grip and hold the diode 113 in place.

The remainder of the structure of FIG. 10 is quite similar to that of FIG. 1. For example, the foot-like elements 116 and 117 fit into holes 118 and 119 in circuit board 20 to secure the U-shaped element channel 100 securely to said circuit board 20.

It is to be understood that the forms of the invention shown and described herein and but preferred embodiments thereof and that various modifications and changes can be made therein without departing from the spirit or scope of the invention.

What is claimed is:

1. Mounting means for mounting a plurality of diodes upon a substrate comprising the combination of:
 a plurality of apertures formed in said substrate;
 a plurality of female contact receptacles individually positioned in each of said apertures;
 an elongated channel-shaped element having a generally U-shaped cross-sectional configuration formed by side walls and a transverse section and positioned over said apertures in an inverted manner, with at least portions of the open edges of said side walls of said channel resting upon the surface of said substrate and electrically insulated from said female contact receptacles at all points;
 a plurality of second apertures formed in the transverse section of said channel, with each of said second apertures being substantially concentric with respect to one of said first apertures;
 said female receptacles each being constructed to receive a first terminal of a diode inserted in the associated concentric aperture in said channel element; and
 said associated concentric aperture being of a size to receive and make physical contact with the diode inserted therethrough to both mechanically support said diode and also to make electrical contact with the second terminal of said diode.

2. Mounting means in accordance with claim 1 in which said inverted channel-shaped element comprises spring members formed in at least one side thereof with at least one of said spring members being adjacent at least one diode inserted in said channel-shaped element and being bent inwardly to press against said diode to provide mechanical support for said diode.

3. Mounting means in accordance with claim 1 in which said inverted channel-shaped element comprises spring cantilever members formed in the sides thereof, with a pair of said spring cantilever members being adjacent opposite sides of each diode inserted in said channel-shaped element and with each spring cantilever member being bent to press against said diode to provide mechanical support of, and electrical contact with, said diode.

4. Mounting means in accordance with claim 1 in which said inverted channel-shaped element comprises diode supporting elements formed in at least one side thereof to provide mechanical support for said diodes.

5. Mounting means in accordance with claim 1 in which said inverted channel-shaped element comprises concave portions formed in said sides thereof with said concave portions being formed between adjacent diodes and in both side walls of said U-shaped channel to form a quasi-cylindrical supporting section around a portion of each diode inserted in the holes in said channel-shaped element to provide mechanical support for said diode.

6. Mounting means for mounting a plurality of diodes upon a substrate comprising the combination of:
 a plurality of female contact receptacles individually mounted in said substrate;
 an elongated channel-shaped element having a pair of side walls and a transverse section joining together said side walls to form a generally U-shaped cross-sectional configuration;
 said elongated channel-shaped element being secured on said substrate over said apertures in an inverted manner with at least a portion of the open edges of the side walls of said channel making contact with the surface of said substrate and electrically insulated from said female contact receptacles; and
 a plurality of apertures formed in the transverse section of said channel-shaped element, with each of said apertures being positioned over one of said female contact receptacles;
 said female receptacles each being constructed to receive a first terminal of a diode inserted in the aperture positioned thereover;
 each of said apertures being of a size to receive and make physical contact with the diode inserted therethrough to both mechanically support said diode and also to make electrical contact with the second terminal of said diode.

7. Mounting means in accordance with claim 6 in which said channel-shaped element comprises spring members formed in at least one side thereof and positioned to press against said diode to provide mechanical support for said diode.

8. Mounting means in accordance with claim 6 in which said channel-shaped element comprises spring cantilever members formed in the sides thereof with a pair of said spring members being adjacent opposite sides of each diode inserted in said channel-shaped element and with each spring member being bent inwardly to press against said diode to provide mechanical support for said diode.

9. Mounting means in accordance with claim 6 in which said channel-shaped element comprises concave portions formed in at least one side thereof and with at least one of said concave portions being positioned between adjacent diodes inserted in said channel-shaped element to provide a quasi-cylindrical supporting section around a portion of each diode which presses against said each diode to provide mechanical support of, and electrical contact with, said diode.

10. Mounting means in accordance with claim 6 in which said channel-shaped element comprises concave portions formed in both sides thereof between adjacent diodes to form a quasi-cylindrical supporting section around each diode inserted in the holes in said U-shaped channel to provide mechanical support of, and electrical contact with, said diode.

11. Mounting means for mounting a plurality of diodes upon a substrate comprising the combination of:

a plurality of female contact receptacles individually mounted in said substrate;

an elongated channel-shaped element comprising a pair of sides and a transverse section joining said sides together to provide a generally U-shaped cross-sectional configuration which is positioned over said apertures in an inverted manner, with the open side of said channel facing the surface of said substrate and electrically insulated from said female contact receptacles;

a plurality of apertures formed in the transverse section of said channel with each of said apertures being positioned substantially directly over one of said female contact receptacles;

said female contact receptacles each being constructed to receive a first terminal of a diode inserted through the aperture positioned directly thereover; and securing means attached to the open edges of the side walls of said channel-shaped element and constructed to engage said substrate to retain said channel-shaped element thereon;

said apertures being of a size to receive and make physical contact with the diode inserted therethrough to mechanically support said diode and to make electrical contact with the second terminal of said diode.

12. Mounting means in accordance with claim 11 in which said inverted U-shaped channel comprises spring members formed in at least one side thereof with at least one of said spring members being adjacent at least one diode inserted in said U-shaped channel and being bent inwardly to press against said diode to provide mechanical support for said diode.

13. Mounting means in accordance with claim 11 in which said inverted U-shaped channel comprises spring cantilever members formed in the sides thereof with a pair of said spring members being adjacent opposite sides of each diode inserted in said U-shaped channel and with each spring member formed to press against said diode to provide mechanical support for said diode.

14. Mounting means in accordance with claim 11 in which said inverted U-shaped channel comprises concave portions formed in at least one side thereof with at least one of said concave portions being positioned between adjacent diodes inserted in said U-shaped channel to provide a quasi-cylindrical supporting section around a portion of said adjacent diodes which presses against said adjacent diode to provide mechanical support for said adjacent diodes.

15. Mounting means in accordance with claim 11 in which said inverted U-shaped channel comprises concave portions formed in both side walls thereof between adjacent diodes and to form a quasi-cylindrical supporting sections around a portion of said adjacent diodes inserted in the holes in said U-shaped channel to provide mechanical support for said adjacent diodes.

16. In combination with a circuit board:

a plurality of diodes having first and second terminals;

a plurality of female connectors mounted on receptacles formed on said circuit board for individually receiving a first terminal of one of said plurality of diodes;

an elongated inverted channel member of conductive material and having a pair of side walls and a transverse wall joining together said side walls; and a plurality of holes formed in said transverse wall with each hole being positioned over one of said female receptacles and having a size constructed to grip and hold a diode inserted therein with said first diode terminal being inserted in said female receptacle positioned below said hole;

said inverted channel being insulated from the said female receptacles positioned therebelow.

17. Mounting means in accordance with claim 16 in which said inverted channel comprises spring members formed in at least one side wall thereof and with at least one of said spring members being adjacent at least one diode inserted in said inverted channel and being formed to press against said diode to provide mechanical support for said diode.

18. Mounting means in accordance with claim 16 in which said inverted channel comprises spring cantilever members formed in both side walls thereof with one pair of said spring members being adjacent opposite sides of each diode and with each spring member being formed to press against said diode to provide mechanical support for said diode.

19. Mounting means in accordance with claim 16 in which said inverted channel comprises concave portions formed in at least one side wall between adjacent diodes to provide a supporting means which presses against said adjacent diodes to provide mechanical support for said diode.

20. Mounting means in accordance with claim 16 in which said inverted channel comprises diode supporting elements formed in the side walls thereof to provide mechanical support for said diodes.

* * * * *